(12) United States Patent
Gao

(10) Patent No.: US 11,382,241 B2
(45) Date of Patent: Jul. 5, 2022

(54) COOLING DEVICES FOR EDGE COMPUTING AND HETEROGENEOUS COMPUTING ELECTRONICS HARDWARE

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/582,625

(22) Filed: Sep. 25, 2019

(65) Prior Publication Data

US 2021/0092878 A1 Mar. 25, 2021

(51) Int. Cl.
*H05K 7/20* (2006.01)
*H01L 23/473* (2006.01)

(52) U.S. Cl.
CPC ..... *H05K 7/20772* (2013.01); *H05K 7/20254* (2013.01); *H05K 7/20272* (2013.01); *H01L 23/473* (2013.01)

(58) Field of Classification Search
CPC ........... H05K 7/20218; H05K 7/20254; H05K 7/20509; H05K 7/20272; H05K 2201/06; H01L 23/473; G06F 1/203
USPC ....................... 361/699, 701–702, 718–719; 165/80.3–80.5, 104.33; 257/714, 252
See application file for complete search history.

(56) References Cited

U.S. PATENT DOCUMENTS

| | | | | |
|---|---|---|---|---|
| 5,050,037 A | * | 9/1991 | Yamamoto .......... | H01L 23/4332 361/699 |
| 6,349,032 B1 | * | 2/2002 | Chan .................. | H01L 23/4093 257/718 |
| 7,903,421 B2 | * | 3/2011 | Lv ....................... | H01L 23/4093 361/719 |
| 10,548,239 B1 | * | 1/2020 | Iyengar .............. | H05K 7/20254 |
| 2010/0091447 A1 | * | 4/2010 | Jaggers .............. | H05K 7/20254 361/679.47 |
| 2013/0255925 A1 | * | 10/2013 | Koontz ................ | H01L 23/473 165/168 |
| 2014/0093723 A1 | * | 4/2014 | Takeuchi ............... | F28F 21/08 428/336 |

(Continued)

FOREIGN PATENT DOCUMENTS

| | | | | |
|---|---|---|---|---|
| DE | 102005048492 A1 | * | 4/2007 | ......... H01L 23/4012 |
| EP | 3249685 A1 | * | 11/2017 | ............. H01L 25/16 |

*Primary Examiner* — Zachary Pape
*Assistant Examiner* — Amir A Jalali
(74) *Attorney, Agent, or Firm* — Womble Bond Dickinson (US) LLP

(57) ABSTRACT

In one embodiment, a cooling device for providing liquid cooling to a processor or a computing hardware/system includes a first cooling plate having a first liquid distribution channel integrated therein. The first cooling plate is to be positioned on a top surface of a processor to extract heat from the top surface of the processor using cooling liquid flowing through the first liquid distribution channel. The cooling device further includes a second cooling plate having a second liquid distribution channel integrated therein. The second cooling plate is to be positioned at a bottom surface of the processor to extract heat from the bottom surface of the processor using cooling liquid flowing through the second liquid distribution channel. The cooling device further includes a mounting mechanism to mount the first and second cooling plates onto top and bottom of the processor to sandwich the process in between with good thermal contact.

17 Claims, 10 Drawing Sheets

(56) References Cited

U.S. PATENT DOCUMENTS

| | | | | |
|---|---|---|---|---|
| 2014/0151872 A1* | 6/2014 | Ogawa | | H01L 23/4006 |
| | | | | 257/719 |
| 2014/0262161 A1* | 9/2014 | Weigand | | G06F 1/203 |
| | | | | 165/104.33 |
| 2015/0274138 A1* | 10/2015 | Heise | | B60T 7/12 |
| | | | | 361/752 |
| 2015/0282362 A1* | 10/2015 | Nuriya | | H05K 5/06 |
| | | | | 361/728 |
| 2016/0081178 A1* | 3/2016 | D'Onofrio | | H05K 7/20218 |
| | | | | 361/699 |
| 2016/0183407 A1* | 6/2016 | Katsumata | | H05K 1/0203 |
| | | | | 361/699 |
| 2016/0316589 A1* | 10/2016 | Silvennoinen | | H01L 23/473 |
| 2017/0133298 A1* | 5/2017 | Gutala | | H01L 23/3677 |
| 2017/0156240 A1* | 6/2017 | Silvennoinen | | H01L 23/427 |
| 2017/0245397 A1* | 8/2017 | Hirano | | H05K 7/20809 |
| 2018/0040537 A1* | 2/2018 | Grassmann | | H01L 23/3114 |
| 2018/0132353 A1* | 5/2018 | Predon | | H05K 3/22 |
| 2019/0045635 A1* | 2/2019 | Chin | | H02G 3/03 |
| 2019/0132995 A1* | 5/2019 | Qu | | H05K 1/181 |
| 2019/0259632 A1* | 8/2019 | Isaacs | | H01L 23/473 |
| 2019/0269005 A1* | 8/2019 | He | | F28F 3/02 |
| 2019/0320548 A1* | 10/2019 | Gao | | H05K 7/208 |
| 2019/0341327 A1* | 11/2019 | Teysseyre | | H01L 23/473 |
| 2019/0380225 A1* | 12/2019 | Thompson | | H05K 7/2049 |
| 2020/0068749 A1* | 2/2020 | Ono | | H05K 7/20927 |
| 2020/0075452 A1* | 3/2020 | Matsuzawa | | H01L 23/3672 |
| 2020/0163253 A1* | 5/2020 | Lunsman | | G06F 1/20 |
| 2020/0187385 A1* | 6/2020 | Olesen | | H05K 7/20509 |
| 2020/0329551 A1* | 10/2020 | Yamamoto | | F28F 13/00 |
| 2020/0352053 A1* | 11/2020 | Mizerak | | H01L 23/4006 |
| 2021/0043537 A1* | 2/2021 | Faneuf | | H05K 7/20772 |
| 2021/0098333 A1* | 4/2021 | Ku | | H01L 24/29 |

* cited by examiner

COOLING DEVICES FOR EDGE COMPUTING AND HETEROGENEOUS COMPUTING ELECTRONICS HARDWARE

FIELD OF THE DISCLOSURE

Embodiments of the present invention relate generally to data centers. More particularly, embodiments of the invention relate to cooling devices for edge computing and heterogeneous computer electronics hardware.

BACKGROUND

Thermal management of high power density chips and processors are critical problems, especially with the increasing of power density of high end chips, such as CPUs (central processing units) and GPUs (general-purpose processing units). Cooling devices which are utilized in cooling system designs are used for maintaining the thermal conditions of the chips by removing the heat generated by the chips. If the temperature exceeds the limitation of the thermal specification, the chips may not function properly and throttling may happen, or even been damaged. In addition, by providing proper or better thermal conditions for the chip when it is working, better performance or less power consumption can be achieved.

Edge computing has becoming more and more important in AI era, especially when combining with 5G technology. Edge computing requires revolution changes on both software and hardware architectures and infrastructures. The edge computing hardware is exposed to a more challenging environment than the servers in the data center. This means these devices are designed to be working in a more severe environment. The data center thermal environment is very well controlled. The edge computing hardware may experience any type of hash environment.

In addition, the heterogeneous packaging having HBM (high bandwidth memory), processors, and other electronics components packed together and closer to each other has significantly changed the form factors and design of the processors, such as GPU (general-purpose processing unit) card. New packaging method such as heterogeneous packaging has significant changed the design of the chips which brings in more challenges in the corresponding thermal management. In addition, most of these cards may need liquid cooling solution in many use cases, therefore, a robust thermal design method is critical.

There are many solution providers currently offering high performance CPU and GPU solutions. Most of the solution require a customized thermal management solution and cooling devices, such as an air cooled heat sink or liquid cooled cold plate. Not only the form factors are different, but also the mounting method are significantly different. All these result in significant difficulty in designing and selecting a proper cooling device. A standardized design may benefit the chip vendors, the cooling hardware vendors as well as the end users.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
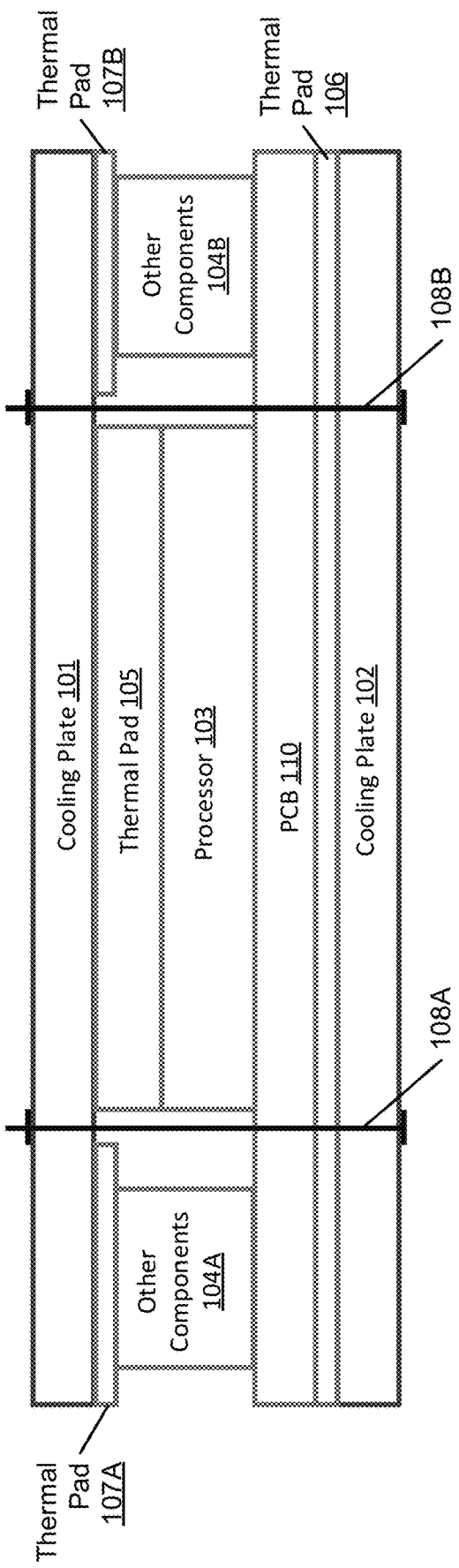
FIG. 1 is a block diagram illustrating a cooling device according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide a cooling device design for edge computing electronics and heterogeneous packaging devices such as GPU card or SOC (system on chip) devices. The cooling design includes a cooling plate, which includes a liquid or coolant (e.g., water) distribution channel and/or liquid fins embedded therein. The cooling plate also includes a supply and return ports for connecting with the external cooling source or cooling loop. The cooling plate may be assembled either on a bottom section, a top section, or both to thermally covering and connecting to the electronics devices such as processors, memory devices, etc. A mounting mechanism is used for fixing the cooling plate with the electronics devices. A mounting pole may be utilized and can be either prefixed on the electronics devices or designed as a separate unit. The mounting pole design requires to provide a protection on the electronics and at the same time, and to ensure a sufficient pressure loaded on the electronics which means a good thermal connection between the devices and cooling plate. The sufficient pressure is to ensure a good thermal connection between the cooling unit and the electronics. The fluid inlet port and outlet port can be assembled on multiple locations on the cooling devices based on actual use case, and the mounting method can be flexible varied and adjusted based on actual design of computing board and cooling sections. The solution may also be used on regular server IT equipment with proper modification.

According to one aspect, a cooling device for providing liquid cooling to a processor includes a first cooling plate (also referred to as a top cooling plate) having a first liquid distribution channel integrated therein. The first cooling plate is to be positioned on a top surface of a processor to extract heat from the top surface of the processor using cooling liquid flowing through the first liquid distribution channel. The cooling device further includes a second cooling plate (also referred to as a bottom cooling plate) having a second liquid distribution channel integrated therein. The second cooling plate is to be positioned at a bottom surface of the processor to extract heat from the bottom surface of the processor using cooling liquid flowing through the second liquid distribution channel. The cooling device further includes a mounting mechanism to mount the first and second cooling plates onto top and bottom of the processor to sandwich the process in between with good thermal contact. It needs to be mentioned that the internal design of the cooling plate is not described in detailed. Fluid channel can be integrated inside for fluid distribution and fluid fin can be used for enhancing heat transfer area.

In one embodiment, the cooling device further includes a first thermal pad (e.g., a thin layer of thermal conductive material) disposed between the first cooling plate and the top surface of the processor, where the first thermal pad is heat conductive and dielectric. The cooling device further includes a second thermal pad disposed between the second cooling plate and the bottom surface of the processor, where the second thermal pad is heat conductive and dielectric. The first and second thermal pads are designed to improve the thermal conductance by providing a good contact between the cooling plates and the surface of the processor, while prevent short circuit. The functions of the thermal pad or the thermal interface materials used in the current disclosure provide the following sessions: 1) Filling out the air gap between two contacting surfaces; 2) Enhancing heat transfer; and 3) Decrease the design complexity of the cooling plate.

In one embodiment, when the processor is implemented as a part of a processor card (e.g., a processor package including the processor and other associated components such as memory), the processor may be mounted or soldered on a printed circuit board (PCB) that has electric traces connected to other components of the processor card. In this configuration, the bottom surface of the processor sits on the top surface of the PCB. The second cooling plate is attached to the bottom surface of the PCB, while the second thermal pad may be disposed between the bottom surface of the PCB and the second cooling plate. In one embodiment, several thermal pad can be used on individual electronics instead of a single pad. In another embodiment, different thermal pads or different thermal conduction materials may be used on a same package.

In one embodiment, each of the cooling plates includes an inlet port (also referred to as a supply port) to receive cooling liquid from a liquid manifold and an outlet port (also referred to as a return port) to return the cooling liquid carrying the heat back to the liquid manifold. In another embodiment, one of the cooling plate include an inlet port to receive the cooling liquid from the manifold. The cooling liquid flows through the cooling plate and enters another cooling plate via an intermediate channel or tube. The cooling liquid then flows through the other cooling plate and exits an outlet port of the cooling plate back to the liquid manifold. In one embodiment, the processor is one of the number of processors sharing the cooling plates. In one embodiment, one cooling plate may have multiple fluid inlet and outlet ports. In one embodiment, additional fluid devices such as manifold may be assembled on the cooling plate.

According another aspect, a processor card includes one or more processors and a cooling device that sandwiches the processors therein as described above. According to a further aspect, an electronic rack includes a number of server shelves. Each server shelf includes one or more processor cards and each processor card includes one or more processors sandwiched by one or more cooling devices as described above.

FIG. 1 is a block diagram illustrating an example of a cooling device according to one embodiment. For the purpose of illustration, FIG. 1 shows a processor card or processor package or a full computing system (e.g., system on chip or SOC system) thermally protected by a cooling device. Referring to FIG. 1, a cooling device includes a first cooling plate 101 (also referred to as a top cooling plate) and a second cooling plate 102 (also referred to as a bottom cooling plate). First cooling plate 101 includes a first liquid distribution channel integrated therein and second cooling plate 102 includes a second liquid distribution channel integrated therein to provide liquid cooling to the electronic devices contained therein.

Cooling plate 101 is configured to positioned on a top surface of processor 103 while cooling plate 102 is configured to be positioned at a bottom surface of processor 103. Although only one processor as shown, more processors, as well as other components or electronics 104A-104B, may be positioned between cooling plate 101 and cooling plate 102 to receive liquid cooling. Cooling plate 101 is configured to extract the heat from the top surface of processor 103 using the cooling liquid flowing within the corresponding liquid distribution channel integrated therein. Similarly, cooling plate 102 is configured to extract the heat from the bottom surface of processor 103 using the cooling liquid flowing within the corresponding liquid distribution channel integrated therein. The heat removal operations are performed similarly on other components 104A-104B. The cooling liquid may be received from a liquid manifold (not shown) or any other cooling fluid source supply, flow through cooling plates 101-102 to exchange heat from processor 103, and then return back to the liquid manifold carrying the heat exchanged from processor 103 as well as other components 104A-104B. In such design, theoretically, 100% of the heat generated by the electronics are captured by the cooling plate and cooling fluid within the cooling plate.

In one embodiment, in order maximize the thermal conductive area between the cooling plates 101-102 and the surface of processor 103, a thermal pad 105 (e.g., a layer of thermally conductive material) may be placed between cooling plate 101 and the top surface of processor 103. Similarly, a thermal pad 106 may be placed between cooling plate 102 and the bottom surface of processor 103. Thermal pads 105-106 may be made of heat conductive and dielectric material. Similarly, for components 104A-104B, thermal pads 107A-107B may be utilized. In the example as shown in FIG. 1, if processor 103 and other components 104A-104B are mounted or soldered on a PCB 110, thermal pad 106 may be placed between the bottom surface of PCB 110 and cooling plate 102. The thermal pad can be also considered and designed as a thermal cover or thermal cap.

According to one embodiment, the cooling device further includes a mounting mechanism to mount and assemble cooling plates 101-102 onto the top and bottom surfaces of the components therein, such as processor 103 and components 104A-104B. In this example as shown in FIG. 1, the mounting mechanism is implemented in a form of one or more mounting pins or mounting poles 108A-108B that extend through corresponding mounting holes through cooling plates 101-102. The tops of the mounting pins 108A-108B may be threaded to allow a screw nut or screw cap to screw on to tighten the cooling plates 101-102 together.

Note that the middle session between cooling plates 101 and 102 represents either a single high performance processor, such as a GPU card, or a full system such as customized edge computing device. FIG. 1 shows a simplified version with processors and other electronics such as HBM (high bandwidth memory) packaged on a mother board. In this thermal design, the top or the surrounding of the electronics including the PCB board are covered with either TIM (thermal interface material) or thermal pad, or lid or any other thermal conduction unit. The purpose is to provide heat conductive transfer and fill the gaps between two electronics and cooling plates. Another purpose is to provide a protection on the electronics. The third purpose is to enable a highly simplified design requirement on the cooling plate. For example, one embodiment is using a smooth contracting surface design on the cooling plate instead of designing complex feature to match the multiple electronics components on the PCB. The cooling plate is then attached on the top and bottom of the unit and thermally connected.

Figure 2:
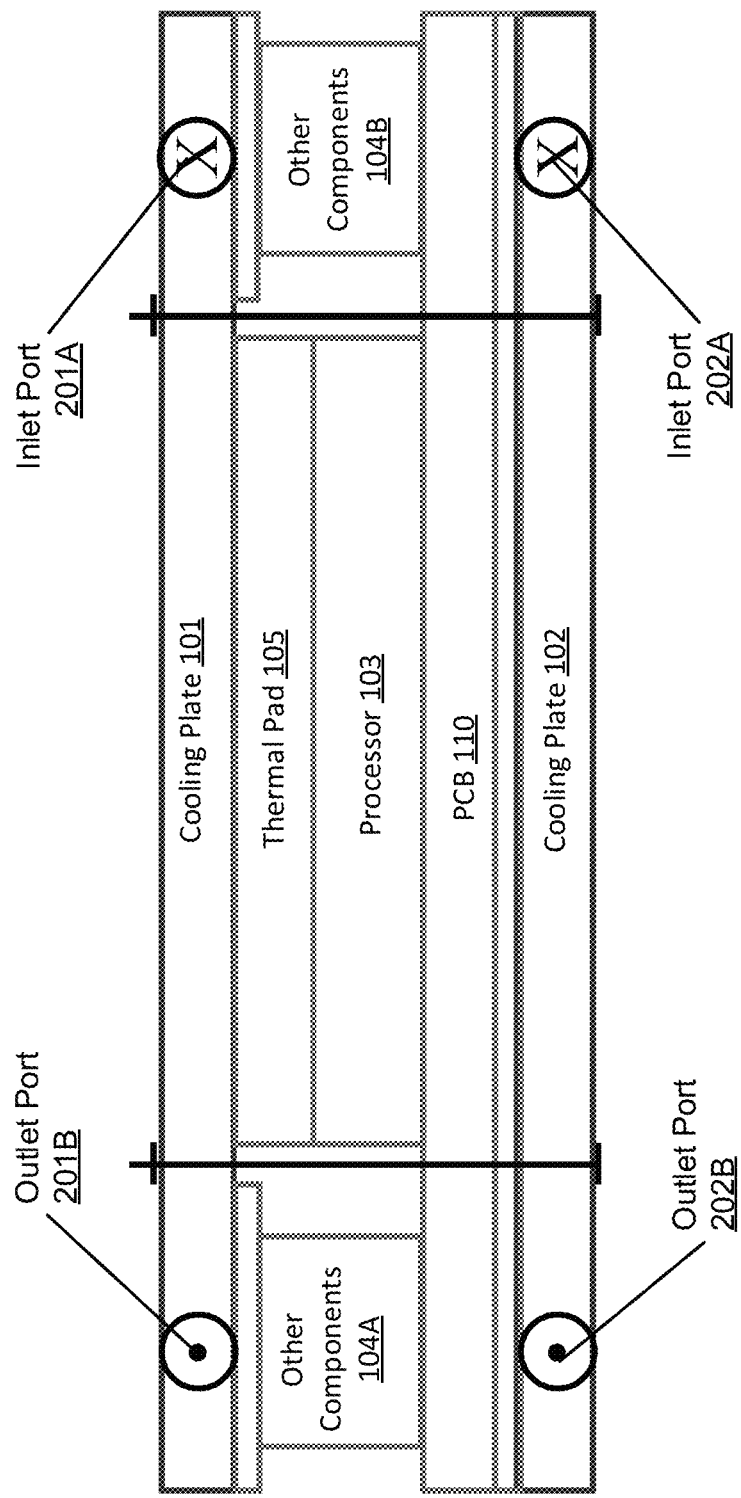
FIG. 2 is a block diagram illustrating a cooling device according to another embodiment.

FIG. 2 is a block diagram illustrating an example of a cooling device according to one embodiment. In this example, cooling plate 101 includes an inlet port 201A to receive cooling liquid from a liquid manifold and an outlet port 201B to return the cooling liquid back to the liquid manifold after traveling through the distribution channel embedded therein. Similarly, cooling plate 102 includes an inlet port 202A to receive cooling liquid from a liquid manifold and an outlet port 202B to return the cooling liquid back to the liquid manifold after traveling through the distribution channel embedded therein. In this configuration, the distribution channels of cooling plates 101 and 102 operate independently. In one embodiment, the inlet and outlet ports can be designed on the top of the cooling plate.

Figure 3A:
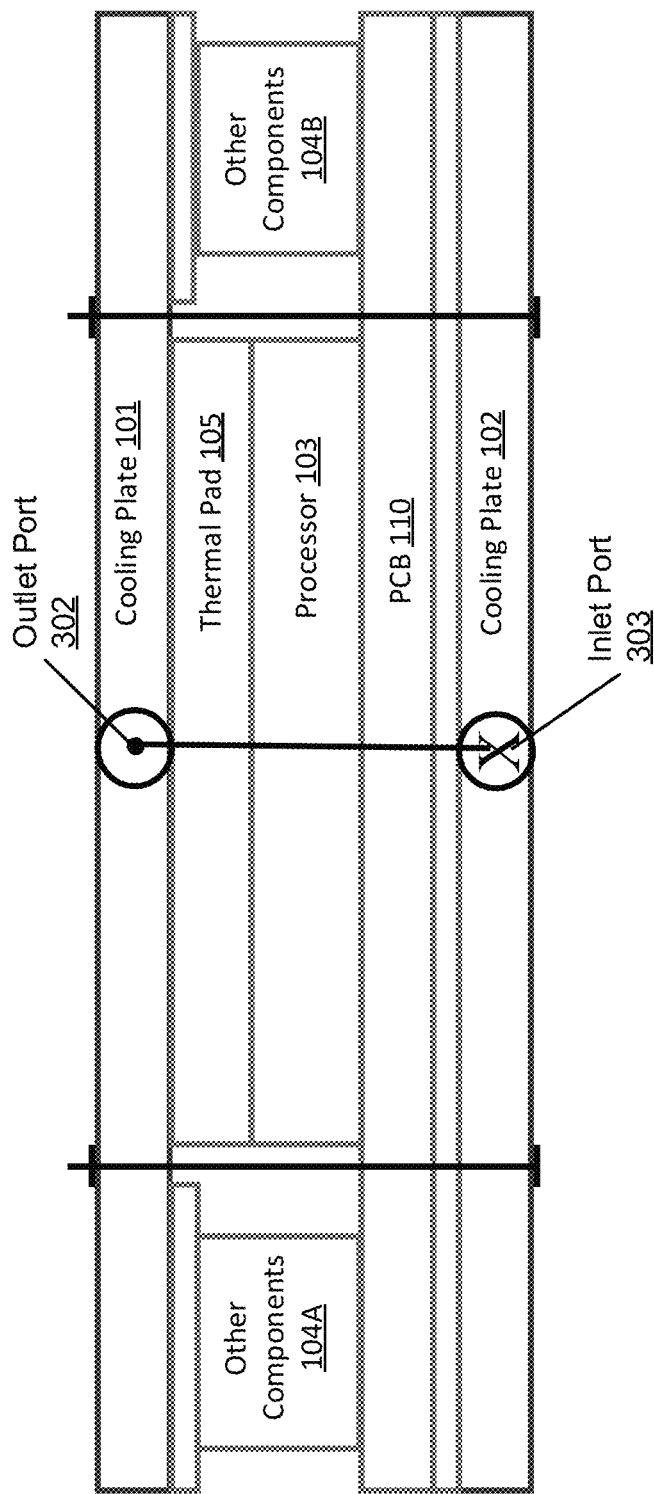
FIGS. 3A and 3B show a cooling device according to another embodiment.
Figure 3B:
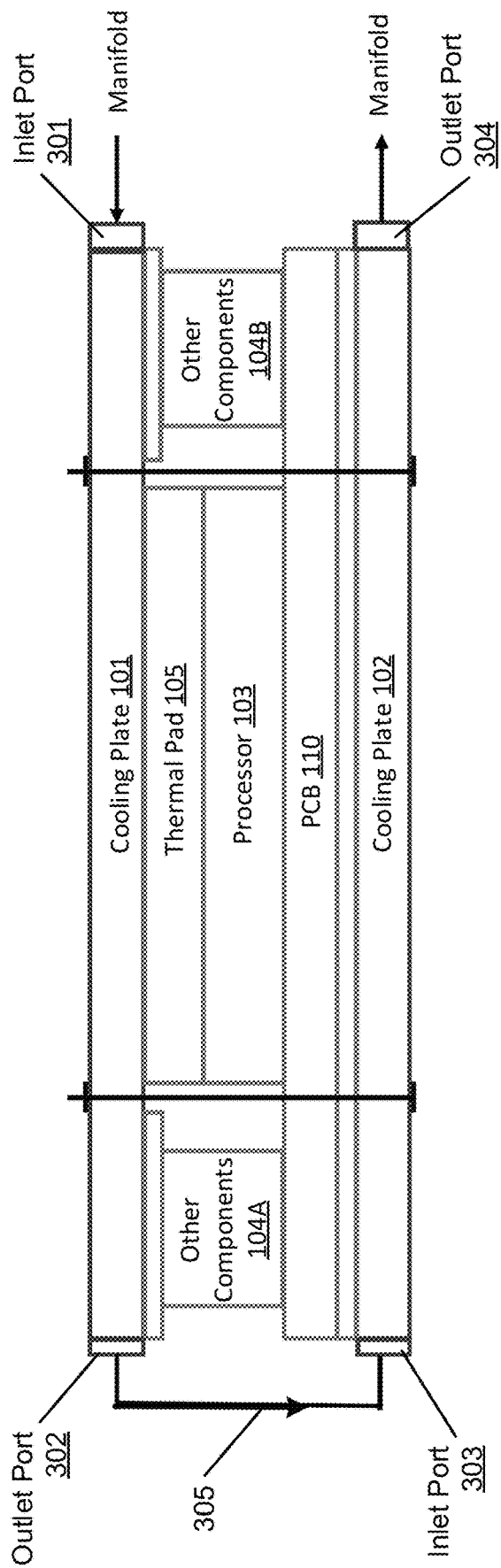

FIGS. 3A-3B are block diagrams illustrating an example of a cooling device according to another embodiment. Referring to FIGS. 3A-3B, in this example, cooling plate 101 includes an inlet port 301 and an outlet port 302. Cooling plate 102 includes an inlet port 303 and an outlet port 304. Inlet port 301 is to receive cooling liquid from a liquid manifold. Outlet port 302 of cooling plate 101 is coupled to inlet port 303 of cooling plate 102 via an intermediate channel or tube 305. Quick disconnects can be used for connecting the fluid ports and tube 305. Outlet port 304 of cooling plate 102 is coupled to the liquid manifold to return the cooling liquid. Thus, the cooling liquid enters inlet port 301 of cooling plate 101, exits from cooling plate 101 via outlet port 302, enters cooling plate 102 via inlet port 303, and then exits from cooling plate 102 via outlet port 304. Note that the configuration may be flipped between cooling plate 101 and cooling plate 102, where cooling plate 102 receives cooling liquid from the liquid manifold and cooling plate 101 returns the cooling liquid back to the liquid manifold. In one embodiment, the outlet port 304 can be used to connect to another inlet port of a cooling plate. This means two cooling plate systems are connected in series manner.

Figure 4:
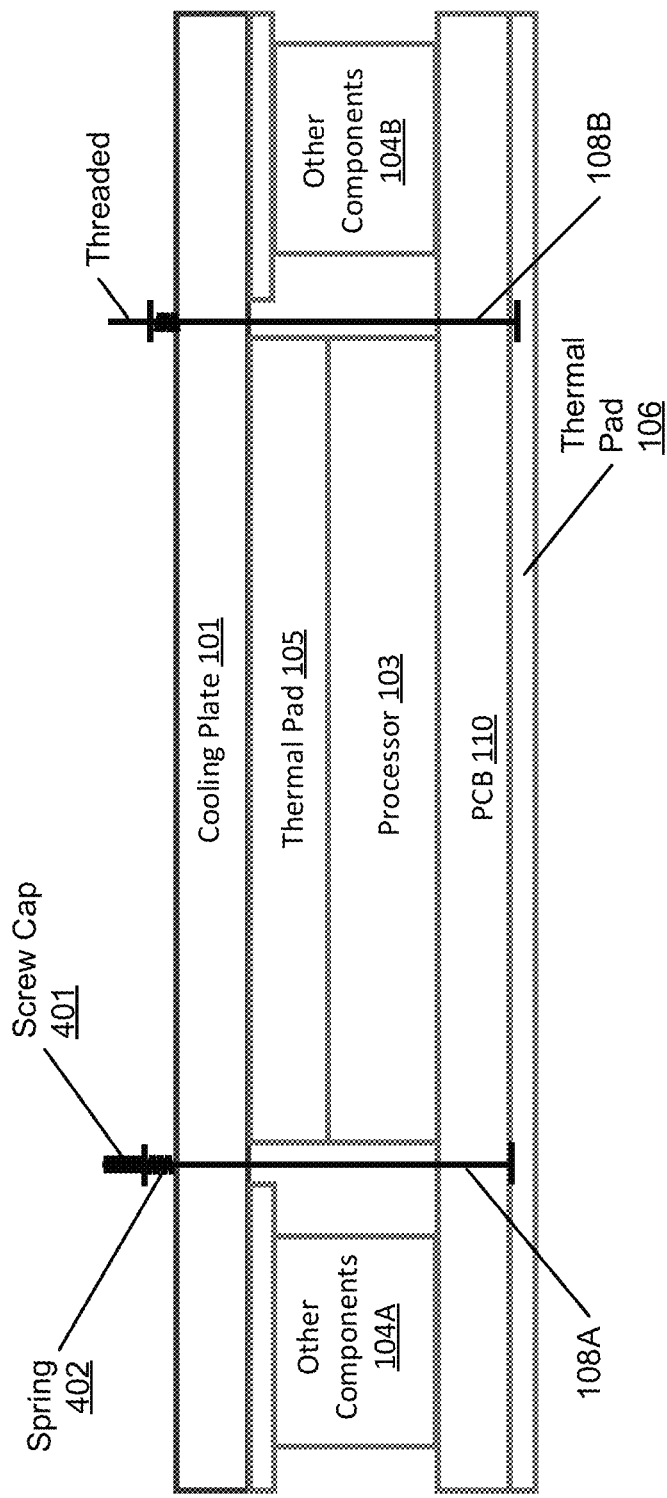
FIG. 4 shows a mounting mechanism of a cooling device according to one embodiment.

FIG. 4 shows a processor card design according to one embodiment. Referring to FIG. 4, cooling plate 101 is mounted on the top of processor 103 using mounting poles or mounting pins 108A-108B. The cooling plate 101 is attached on the top of the unit and then the screw cap 401 is used to fix and tight the cooling plate 101 and the hardware. Threading design is used on the tip of the mounting poles 108A-108B. Springs 402 are used at the location shown in FIG. 4. The spring 402 is used to provide a buffer and protection on the hardware to ensure proper amount of pressure and force are loaded on the electronics. In terms of the mounting poles 108A-108B, the material can be either hard materials or elastic materials. By using elastic materials, it can provide more buffer on the positioning accuracy requirement of the hardware mounting pole and the cooling plate 101.

In the method shown in FIG. 4, the mounting pole 108A together with its component such as the spring 402 or threading portion are part of the electronics hardware. As an example, a GPU card may have 4 mounting poles assembled on its PCB board 110. Thermal pad 106 shown in FIG. 4 may be eliminated when the PCB is attached onto a server chassis. As an example, when applying the method on a GPU card, the thermal pad 106 may be eliminated since the bottom session will be assembled to a motherboard.

Figure 5:
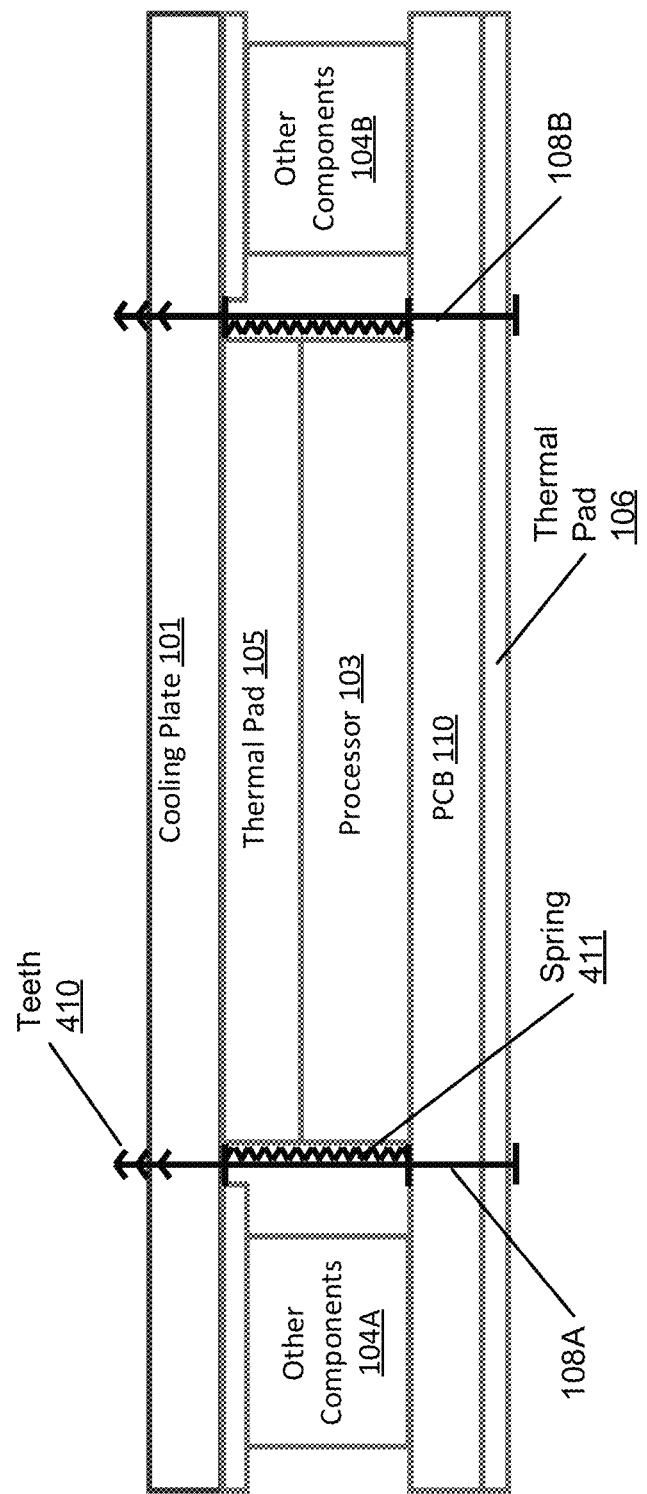
FIG. 5 shows a mounting mechanism of a cooling device according to one embodiment.

FIG. 5 shows another design for a processor card according to one embodiment. Referring to FIG. 5, in this design, teeth 410 are used on the tip of the mounting pole. The teeth provide a locking function when pushing the cooling plate 101 to a certain location. Again, springs 411 are used for ensuing proper pressure loaded on the hardware. Once the spring 411 reach the limited length, it will prevent any additional movement of the cooling plate 101. In FIG. 5, it also shows that the mounting poles 108A-108B can be a separate unit instead of preassembling with the hardware. It can be used as a separate unit for the installing, fixing and positioning the electronics and the cooling devices. It needs to be mentioned that the method can be applied to systems with double side cooling plates attached.

Figure 6A:
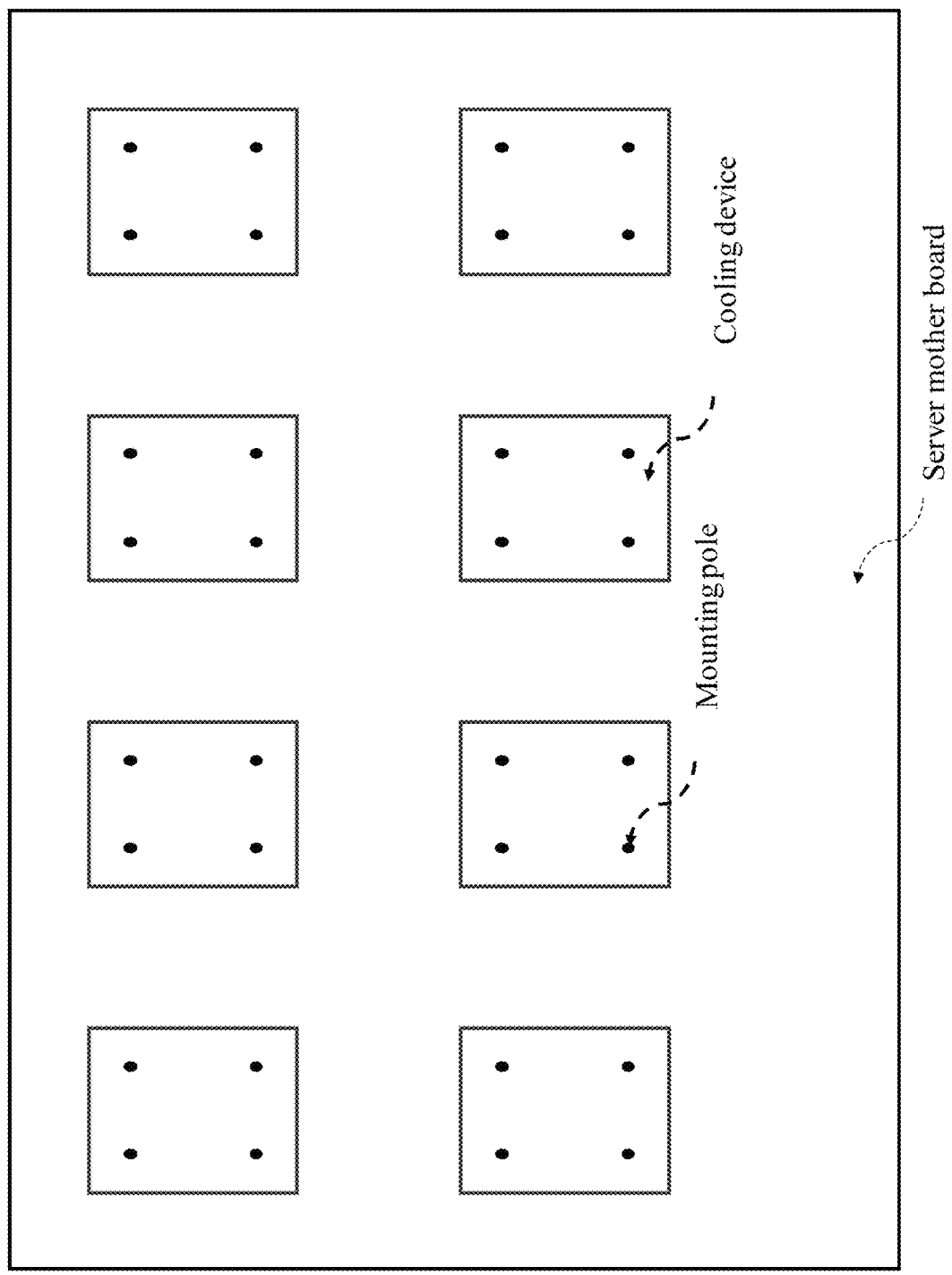
FIGS. 6A-6C show different cooling device configurations according to certain embodiments.
Figure 6B:
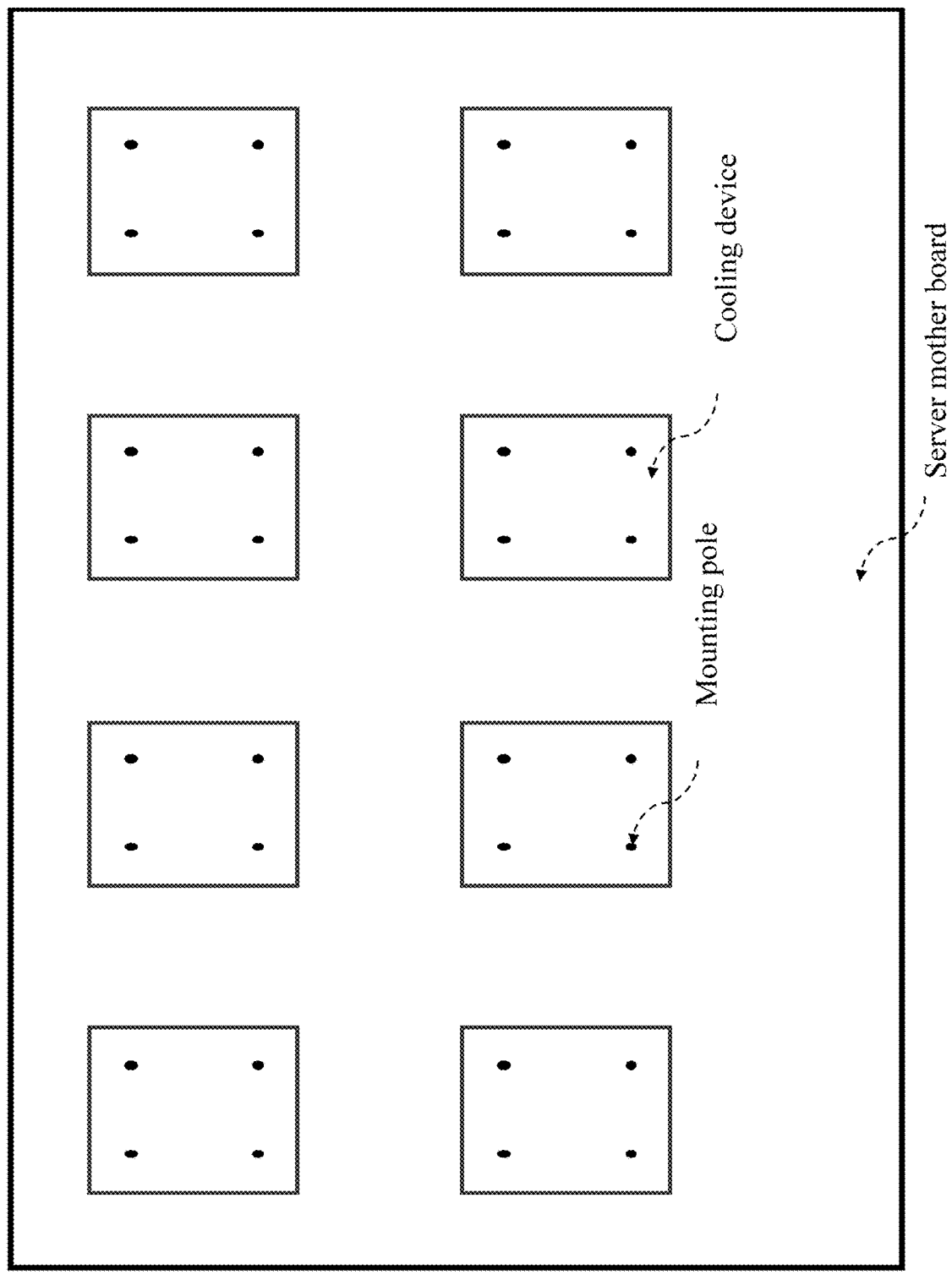
Figure 6C:
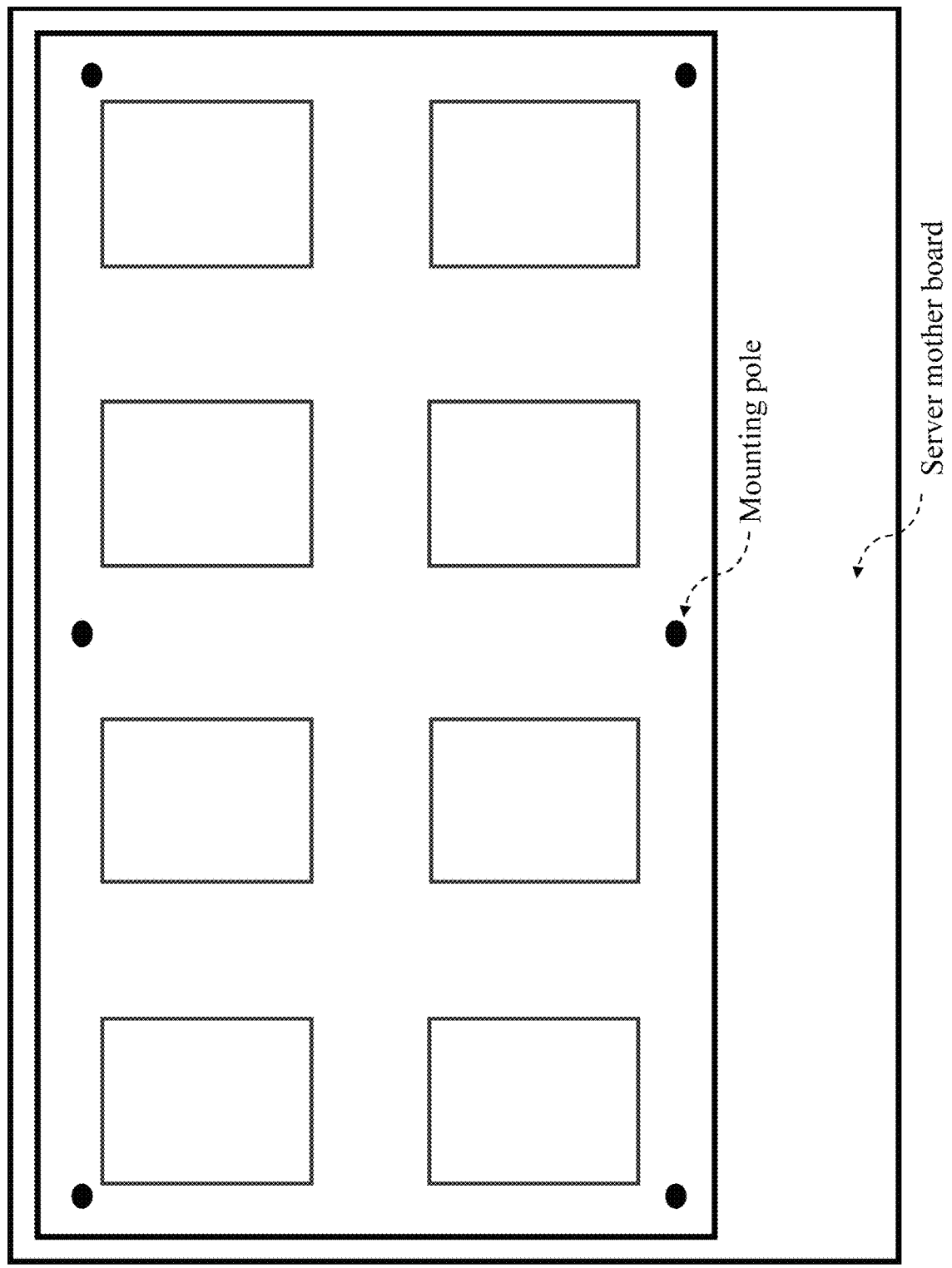

FIG. 6A shows the concept is used on a server motherboard which has multiple high performance or heterogeneous computing devices packaged. Note that, for the purpose of illustration, the fluid piping is not shown. FIG. 6B shows that multiple cooling plates are assembled together as one single cooling plate directly attached on the server motherboard, and the mounting poles are utilized on each of the processor modules. FIG. 6C show a similar design as shown in FIG. 6B, however, the mounting poles are disposed on the edge or surrounding regions. The method shown in FIG. 6C eliminates any requirement on the GPU cards, and the mounting poles are preassembled on the motherboard.

Figure 7B:
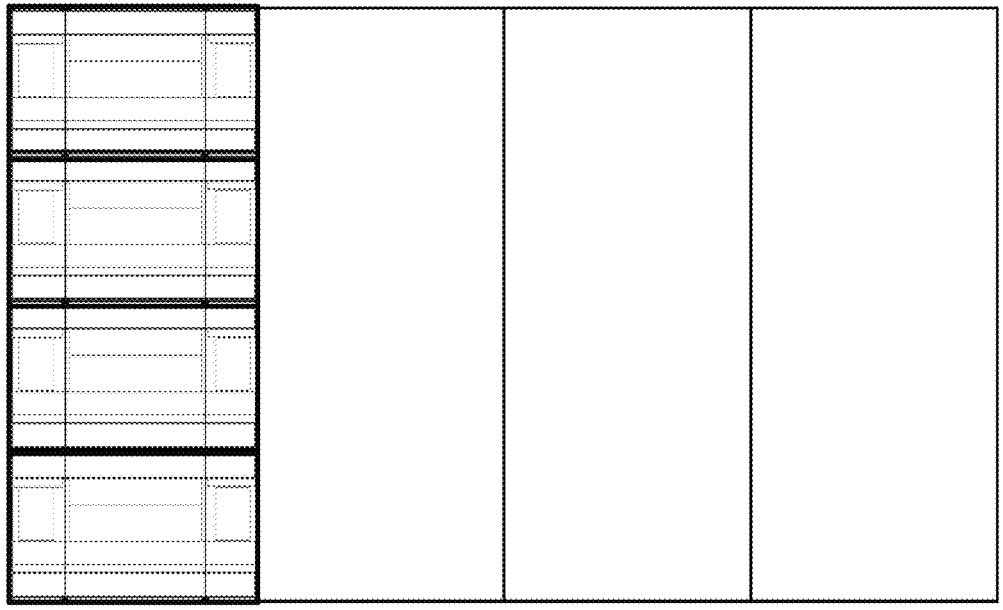
FIGS. 7A and 7B show different configurations of electronic racks according to certain embodiments.
Figure 7A:
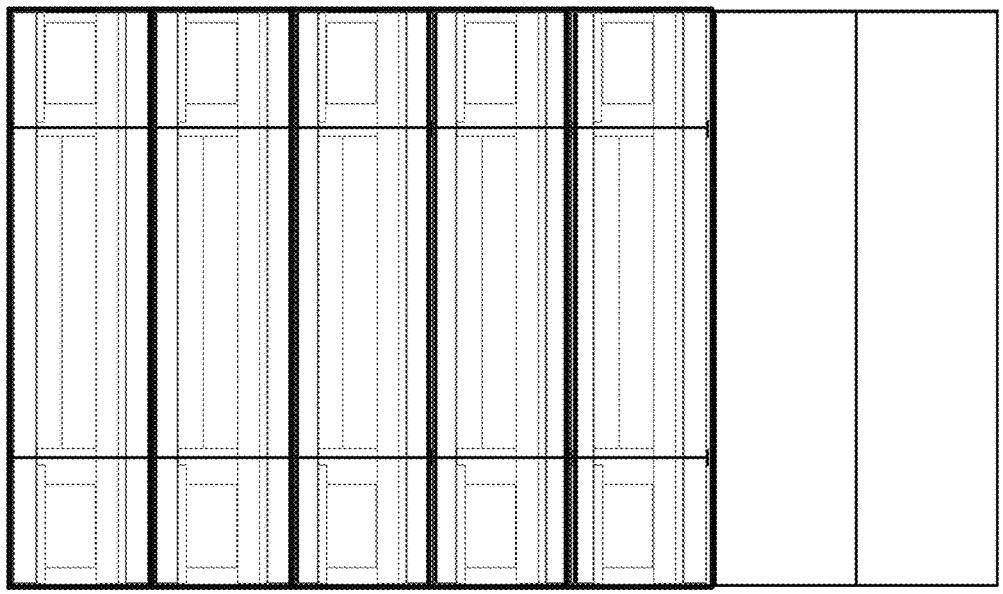

The design as shown in FIGS. 6A-6C can be implemented as a server shelf that can be inserted into any of the server slots or server shelves of an electronic rack as shown in FIG. 7A. Alternatively, a processor card as described above can be inserted vertically into a server shelf, as shown in FIG. 7B, where the server shelf can contain multiple processor cards or IT equipment. In another embodiment, the rack can be also understood as an edge device cabinet, the cabinet presents a deployment form for multiple edge computing systems. Rack or cabinet level cooling design are not presented in the current invention. For data center application, existing rack level liquid cooling solution can be used. For an edge cabinet, either using a similar rack solution or a new design method will work.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device for providing liquid cooling to a processor, the cooling device comprising:
    a first cooling plate having a first liquid distribution channel embedded therein, the first cooling plate to be positioned on a top surface of the processor, wherein the first cooling plate is to extract heat from the top surface of the processor using cooling liquid flowing in the first liquid distribution channel;

a second cooling plate having a second liquid distribution channel embedded therein, the second cooling plate to be positioned at a bottom surface of the processor, wherein the second cooling plate is to extract heat from the bottom surface of the processor using the cooling liquid flowing in the second liquid distribution channel; and a mounting mechanism to mount the first cooling plate onto the top surface of the processor and the second cooling plate onto the bottom surface of the processor to sandwich the processor in between by a single mounting pole on each side of the processor and a first thermal pad disposed between the first cooling plate and the top surface of the processor, wherein the processor is mounted on a printed circuit board (PCB), wherein the mounting mechanism includes one or more teeth on a tip of each mounting pole to provide a locking function for the first cooling plate, the first thermal pad containing dielectric material, a second thermal pad disposed between the PCB and the second cooling plate, wherein some of the one or more teeth are inside the first cooling plate and some of the one or more teeth are outside and on the top of the first cooling plate, wherein each mounting pole extends through a mounting hole to reach outside of the bottom surface of the second cooling plate, and wherein each mounting pole includes a spring in direct contact with the first cooling plate and the PCB, and wherein the spring is to ensure a pressure loaded on the mounting mechanism.

2. The cooling device of claim 1, wherein the first thermal pad is heat conductive.

3. The cooling device of claim 1, wherein the second thermal pad is heat conductive.

4. The cooling device of claim 3, wherein the second thermal pad contains dielectric material.

5. The cooling device of claim 3, wherein the bottom surface of the processor is disposed on a top surface of the PCB, and wherein the second cooling plate is positioned at a bottom surface of the PCB.

6. The cooling device of claim 1, wherein each of the first liquid distribution channel and the second liquid distribution channel comprises an inlet port to receive cooling liquid from a liquid manifold and an outlet port to return the cooling liquid carrying the heat extracted from the processor back to the liquid manifold.

7. The cooling liquid of claim 1, wherein the first liquid distribution channel comprises a first inlet port and a first outlet port, and wherein the second liquid distribution channel comprises a second inlet port and a second outlet port.

8. The cooling device of claim 7, wherein the first outlet port is connected to the second inlet port via an intermediate tube, such that the cooling liquid travels through the first and second cooling devices.

9. The cooling device of claim 8, wherein the first inlet port is configured to receive the cooling liquid from a liquid manifold, and wherein the second outlet port is configured to return the cooling liquid carrying the heat extracted from the processor back to the liquid manifold.

10. The cooling device of claim 1, wherein the first cooling plate and the second cooling plate are configured to further provide liquid cooling to a memory device associated with the processor and disposed between the first cooling plate and the second cooling plate.

11. The cooling device of claim 1, wherein the processor is one of a plurality of processors sandwiched between the first cooling plate and the second cooling plate.

12. A processor card, comprising:

a processor;

a first cooling plate having a first liquid distribution channel embedded therein, the first cooling plate to be positioned on a top surface of the processor, wherein the first cooling plate is to extract heat from the top surface of the processor using cooling liquid flowing in the first liquid distribution channel;

a second cooling plate having a second liquid distribution channel embedded therein, the second cooling plate to be positioned at a bottom surface of the processor, wherein the second cooling plate is to extract heat from the bottom surface of the processor using the cooling liquid flowing in the second liquid distribution channel; and a mounting mechanism to mount the first cooling plate onto the top surface of the processor and the second cooling plate onto the bottom surface of the processor to sandwich the processor in between by a single mounting pole on each side of the processor and a first thermal pad disposed between the first cooling plate and the top surface of the processor, wherein the processor is mounted on a printed circuit board (PCB), wherein the mounting mechanism includes one or more teeth on a tip of each mounting pole to provide a locking function for the first cooling plate, the first thermal pad containing dielectric material, a second thermal pad disposed between the PCB and the second cooling plate, wherein some of the one or more teeth are inside the first cooling plate and some of the one or more teeth are outside and on the top of the first cooling plate, wherein each mounting pole extends through a mounting hole to reach outside of the bottom surface of the second cooling plate, and wherein each mounting pole includes a spring in direct contact with the first cooling plate and the PCB, and wherein the spring is to ensure a pressure loaded on the mounting mechanism.

13. The processor card of claim 12, wherein the first thermal pad is heat conductive.

14. The processor card of claim 12, wherein the second thermal pad is heat conductive and the second thermal pad contains dielectric material.

15. The processor card of claim 14, wherein the bottom surface of the processor is disposed on a top surface of the PCB, and wherein the second cooling plate is positioned at a bottom surface of the PCB.

16. An electronic rack, comprising:

a plurality of server shelves, each of the server shelves including one or more servers and each server including one or more processor assemblies, wherein each processor assembly comprises:

a processor, a first cooling plate having a first liquid distribution channel embedded therein, the first cooling plate to be positioned on a top surface of the processor, wherein the first cooling plate is to extract heat from the top surface of the processor using cooling liquid flowing in the first liquid distribution channel, a second cooling plate having a second liquid distribution channel embedded therein, the second cooling plate to be positioned at a bottom surface of the processor, wherein the second cooling plate is to extract heat from the bottom surface of the processor using the cooling liquid flowing in the second liquid distribution channel, and a mounting mechanism to mount the first cooling plate onto the top surface of the processor and the second cooling plate onto the bottom surface of the processor to sandwich the processor in between by a single mounting pole on each side of the processor and a first thermal pad disposed between the first cooling plate and the top surface of the processor, wherein the processor is mounted on a printed circuit board (PCB), wherein the mounting mechanism includes one or more teeth on a tip of each mounting pole to provide a locking function for the first cooling plate, the first thermal pad containing dielectric material, a second thermal pad disposed between the PCB and the second cooling plate, wherein some of the one or more teeth are inside the first cooling plate and some of the one or more teeth are outside and on the top of the first cooling plate, wherein each mounting pole extends through a mounting hole to reach outside of the bottom surface of the second cooling plate, and wherein each mounting pole includes a spring in direct contact with the first cooling plate and the PCB, and wherein the spring is to ensure a pressure loaded on the mounting mechanism.

17. The electronic rack of claim 16, wherein the second thermal pad is heat conductive and the second thermal pad contains dielectric material.

* * * * *